(12) United States Patent
Cipriani et al.

(10) Patent No.: US 6,321,072 B1
(45) Date of Patent: Nov. 20, 2001

(54) DISTORTION CONTROL FEEDBACK LOOP UTILIZING A NON-LINEAR TRANSFER FUNCTION GENERATOR TO COMPENSATE FOR NON-LINEARITIES IN A TRANSMITTER CIRCUIT

(75) Inventors: Stefano Cipriani, Pontassieve; Lorenzo Carpineto, Chieti, both of (IT); Anthony A. Takeshian, Laguna Niguel, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/144,404

(22) Filed: Aug. 31, 1998

(51) Int. Cl.[7] .................................................. A04B 1/04
(52) U.S. Cl. ............................................. 455/126; 455/91
(58) Field of Search .................................. 455/126, 127, 455/63, 91

(56) References Cited

U.S. PATENT DOCUMENTS

| | | | |
|---|---|---|---|
| 5,334,945 | * 8/1994 | Yokoya | 330/129 |
| 5,511,239 | * 4/1996 | Dennerlein | 455/126 |
| 5,548,826 | * 8/1996 | Sayers | 455/126 |
| 5,697,074 | * 12/1997 | Makikallio | 455/126 |
| 5,884,150 | * 3/1999 | Sugawara | 455/127 |
| 5,977,833 | * 11/1999 | Attimont | 330/297 |
| 6,141,390 | * 10/2000 | Cova | 375/297 |

* cited by examiner

*Primary Examiner*—Daniel Hunter
*Assistant Examiner*—Nick Corsaro
(74) *Attorney, Agent, or Firm*—Howrey Simon Arnold & White, LLP

(57) ABSTRACT

A transfer function generator provides the ability to provide a non-linear response in a feedback loop to compensate for non-linearities introduced elsewhere in the system. The transfer function generator includes a non-linear function generator configured to provide an output current that is a non-linear function of an input signal representing an error to be corrected. The transfer function generator can also include a linear function generator configure to provide a linear output current as a function of an input current representing the error corrected. Tuning devices can be provided to adjust the turn-on level of the non-linear function generator and the output level of the linear function generator to allow the transfer function generator flexibility in implementation.

8 Claims, 9 Drawing Sheets

DISTORTION CONTROL FEEDBACK LOOP UTILIZING A NON-LINEAR TRANSFER FUNCTION GENERATOR TO COMPENSATE FOR NON-LINEARITIES IN A TRANSMITTER CIRCUIT

RELATED APPLICATION

The present application is related to U.S. patent application Ser. No. 09/148,568, now U.S. Pat. No. 6,160,429 titled "A COMPACT CUBIC FUNCTION GENERATOR," which is of common assignee and was filed on Sep. 4, 1998, and which is incorporated herein by reference in its entirety.

BACKGROUND OF THE INVENTION

1. Field of the Invention

The present invention relates generally to function generators, and more particularly to a flexible transfer function generator.

2. Related Art

Power amplifiers are commonly used in a number of contemporary devices, including, for example, wireless communication devices such as handsets and basestations. In such devices, the power amplifier amplifies the modulated signal to a desired level such that the radiated power from the device's antenna is of sufficient strength to fall within the dynamic range of the intended receiver.

In many applications, closed loop systems are used to control radiated power to within a relatively narrow range. Closed loop systems typically accomplish this goal through the use of a feedback loop. Such feedback loops can include, for example, a power sensor at or near the antenna to detect the actual transmitted power level. The detected power level can be compared with a desired power level to determine a difference between actual and desired power levels. This difference, often represented as a voltage level, is integrated and fed back to the power amplifier to control the output of the power amplifier.

One drawback of contemporary closed-loop systems is that the power amplifier typically has a non-linear transfer function. As such, the response of the overall system, even with the feedback loop, is non-linear. This can result in less-than-desirable response characteristics of the feedback loop. For example, if the loop is operating in a region where there is too little gain, loop response may be slower than desired. If on the other hand, the loop is operating in a region where there is too much gain, the system may go into oscillation.

In some applications, the problem is more prevalent because the power amplifier tends to primarily operate in the non-linear region. For example, in devices such as wireless devices operating according to the GSM standard, the supply voltages tend to be very low and the output power is typically quite high. As such, in this type of application, the power amplifier often operates in the saturation region. As a result, the transfer function of the power amplifier exhibits the above-described non-linear characteristics.

SUMMARY OF THE INVENTION

The present invention provides a system and method for implementing a flexible transfer function generator for a variety of applications. According to one embodiment of the invention, the transfer function generator includes both linear and non-linear function generators to allow the transfer function generator to compensate for non-linearities elsewhere in the implemented system.

In one application, the transfer function generator is provided as a prescaler in a feedback control loop to compensate for non-linearities in the controlled system. The transfer function generator can include tuning components to allow the transfer function generator to be optimized for implementation in a variety of alternative applications, or with a variety of alternative components in a given application.

Specifically, in one embodiment, the transfer function generator includes a tuning device that controls the threshold level at which the non-linear function generator turns-on. In embodiments in which the transfer function generator is implemented to operate on current, the tuning device can be implemented as a resistance that shunts a portion of the input current to ground. In this embodiment, when the input current is greater than the amount shunted to ground, non-linear function generator turns on and provides an output which is a non-linear function of the input current.

Likewise, a tuning device can be implemented to adjust the output of the linear function generator. Similarly, in embodiments operating on current, the tuning device controls the amount of current shunted to ground, thereby controlling the output level of the linear function generator.

In embodiments using both linear and non-linear function generators, the respective outputs of the linear and non-linear function generators can be summed to provide a composite output that responds in such a manner as to provide the transfer function generator with both a linear and a non-linear region. The tuning devices can be used to adjust the characteristics of the response curve of the transfer function generator, including the point at which the response becomes non-linear.

According to one aspect of the invention, the transfer function generator can be implemented in a wireless communication device, such as, for example a device configured to operate according to the GSM standard or other communication protocol or standard. The communication device can include, for example, a power amplifier configured to amplify a signal for transmission by an antenna over a communications channel; a power level sensor configured to sense the power level radiated from the antenna; a comparator configured to compare a difference between the power level sensed by the power level sensor and the desired output power level and to provide a voltage level output indicating the difference; and an integrator configured to integrate the voltage level output from the comparator to provide a voltage level indicating an error level. The transfer function generator can include a non-linear function generator configured to provide an output current that is a non-linear function of an input current representing the voltage output from the integrator, and a linear function generator configure to provide a linear output current as a function of an input current representing the voltage output from the integrator, and a summing junction configured to combine the non-linear output current with the linear output current; wherein the transfer function generator provides a non-linear response to the error signal generated by the integrator to compensate for non-linearity introduced elsewhere in the communication system. The wireless communication system can also include a voltage to current converter, configured to convert the output voltage of the integrator into a current; and a current to voltage converter configured to convert the current output from the transfer function generator to a voltage level and to provide the voltage level to control pins of the power amplifier.

The transfer function generator can further include a first tuning device to control the amount of current needed to turn on the non-linear function generator; and a second tuning device to control the output level of the linear function generator; wherein the first and second tuning devices are variable resistors.

Further features and advantages of the invention as well as the structure and operation of various embodiments of the invention are described in detail below with reference to the accompanying drawings.

BRIEF DESCRIPTION OF THE DRAWINGS

The present invention is described with reference to the accompanying drawings.

DETAILED DESCRIPTION OF THE INVENTION

1. Overview of the Invention

The present invention is directed to a system and method for implementing a flexible transfer function generator in a variety of applications. According to one embodiment of the invention, a transfer function generator is provided as a prescaler in a feedback control loop to compensate for non-linearities in the system. The transfer function generator can include tuning components to allow the non-linear function generator to be optimized for implementation in a variety of alternative applications, or with a variety of alternative components in a given application.

2. Example Environment

Figure 1:
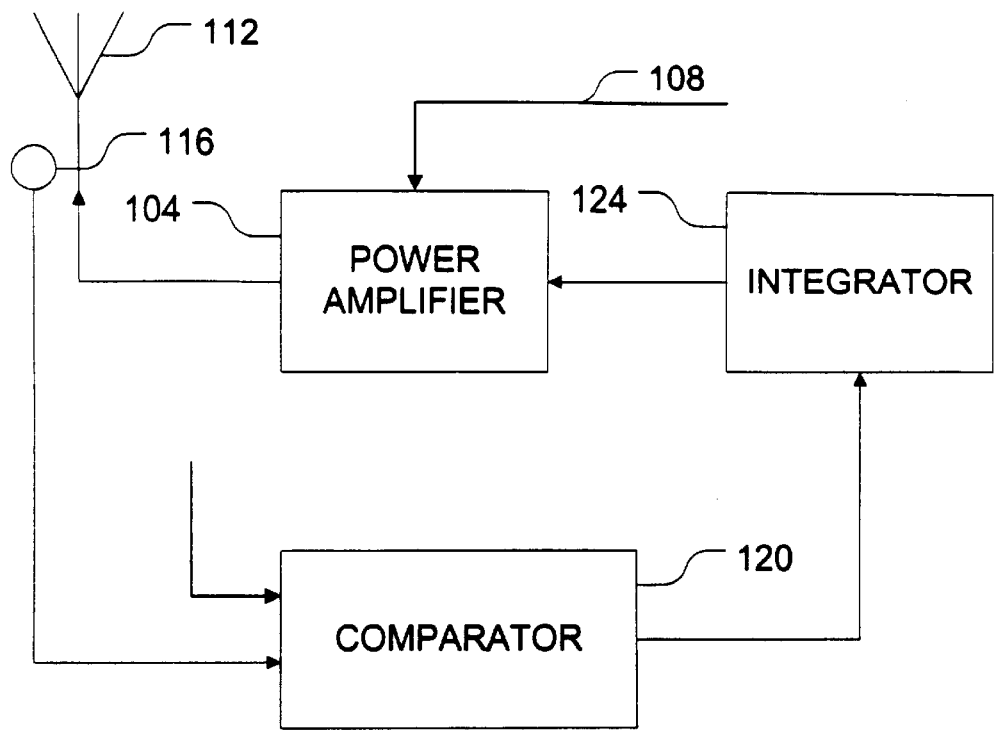
FIG. 1 is a block diagram illustrating an example environment of a communications device having a closed loop feedback system.

Before describing the invention in detail, it is useful to describe an example environment in which the invention can be implemented. Although the invention can be utilized in a number of applications, one example environment in which the invention can be implemented is an environment wherein the output power of a power amplifier is controlled using a closed-loop feedback system. FIG. 1 is a block diagram illustrating the example environment of a closed-loop feedback system to control the output power of a power amplifier. Referring now to FIG. 1, the example environment includes a power amplifier 104, a comparator 120, an integrator 124, an antenna 112, and a power sensor 116. In operation, power amplifier 104 receives a signal 108 to be transmitted via antenna 112. Power amplifier 104 amplifies signal 108 such that the radiated power is sufficient to travel across the communications channel (for example, the air) and be received by the designated receiver or receivers at a signal strength that is within the dynamic range of those receivers.

Because the characteristics of the communications channel and the designated receivers are known, it is possible to specify an output power level, or range of power levels, desired for communications. To ensure that power amplifier 104 is operating in the appropriate range, or at the appropriate power level, the closed-loop system utilizes power sensor 116 to sense the output power from antenna 112. The sensed power level is compared with a signal representing the desired ouput power of the power amplifier 104 by a comparator 120. Any difference between the desired power level and the sensed power level is output by comparator 120, typically as a voltage level. This difference is integrated by an integrator 124 to determine an error level, and the error level provided back to power amplifier 104 to adjust the power output of power amplifier 104. In short, differences between the desired and actual output power are sensed, and are fed back to the power amplifier to adjust its final output power.

Figure 2:
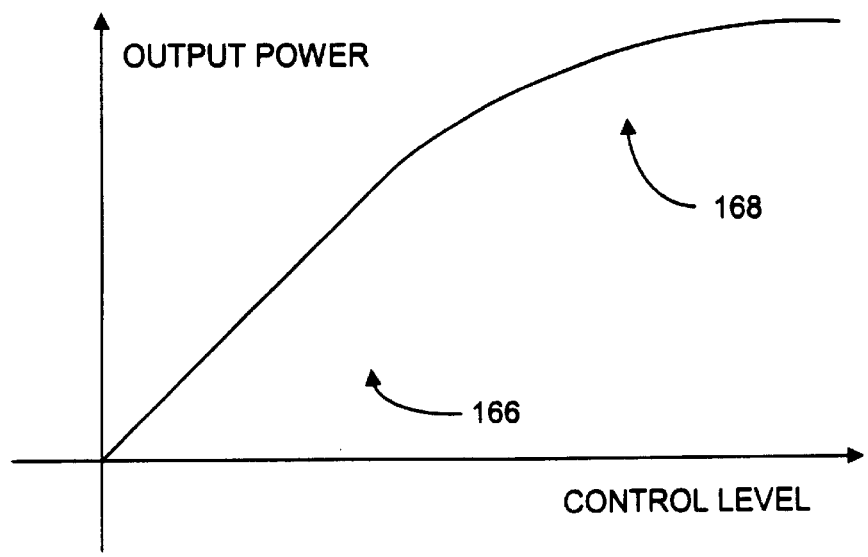
FIG. 2 is a diagram illustrating an example transfer function for the device illustrated in FIG. 1.

One disadvantage of such a closed-loop system is that power amplifier 104 typically exhibits non-linear characteristics. For example, a power amplifier 104 can have a region of its operating range that is linear, and another region that is non-linear. An example transfer function for such a power amplifier is illustrated in FIG. 2. The transfer function illustrated in FIG. 2 is a plot of the actual output power versus an input signal used to control the desired output power, such as at control pins of the power amplifier. As illustrated in the example of FIG. 2, the transfer function has a linear region 166 in which an increase in the desired output power is matched by a proportional, or roughly proportional, increase in the actual output power. However, above a given output power level, the power amplifier behaves non-linearly, as illustrated by non-linear region 168. This example transfer function is provided for illustrative purposes only. After reading this description, it will become apparent to one of ordinary skill in the art that power amplifiers can behave according alternative transfer functions, in which some or all of the operating range is non-linear.

The present invention and its various embodiments are described in this document in terms of this example environment. However, after reading this description, it will become apparent to one of ordinary skill in the art how to implement the invention in alternative environments and applications.

3. Embodiments of the Invention

Figure 3:
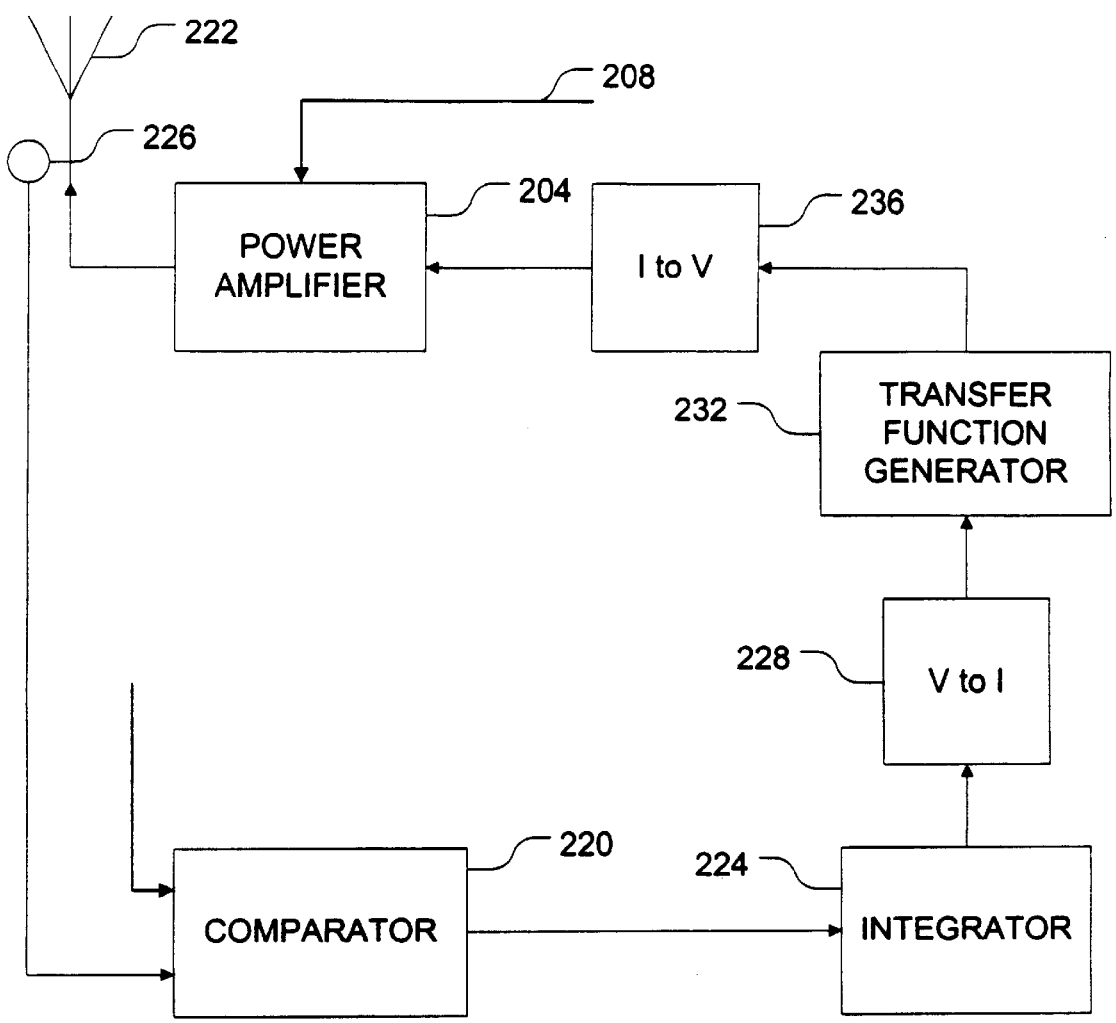
FIG. 3 is a block diagram illustrating a transfer function generator according to one embodiment of the invention implemented in an example environment.

FIG. 3 is a block diagram illustrating an application of the invention in an example environment such as that illustrated in FIG. 2. Referring now to FIG. 3, a transfer function generator 232 is implemented as part of a feedback loop in a closed loop system. Specifically, in the embodiment illustrated in FIG. 3, transfer function generator is provided in the feedback loop between a comparator 220 and a power amplifier 204. Transfer function generator 232 is implemented as having a non-linear transfer function such that its response in the system compensates for other non-linearities in the system. These other non-linearities may be those associated with power amplifier 204, as well as non-linearities that may be associated with other components in the system.

In a preferred embodiment, transfer function generator 232 operates on current rather than voltage. As such, in the illustrated embodiment, converters 228, 236 are provided to convert the voltage levels from the comparator into current, and to convert the current output of transfer function generator 232 into voltage. The output voltage can then be used to control power amplifier 204. Note that in alternative embodiments, transfer function generator 232 can be implemented such that it operates on voltage, as opposed to current. In these alternative embodiments, voltage to current and current to voltage converters 228, 236 are not needed. Additionally, power amplifier 204 can be implemented such that it is controlled by a current level, rather than a voltage level. As such, it can be seen that, even if transfer function generator 232 were working in current, current to voltage converter 236 would not be needed in this particular application.

Figure 4:
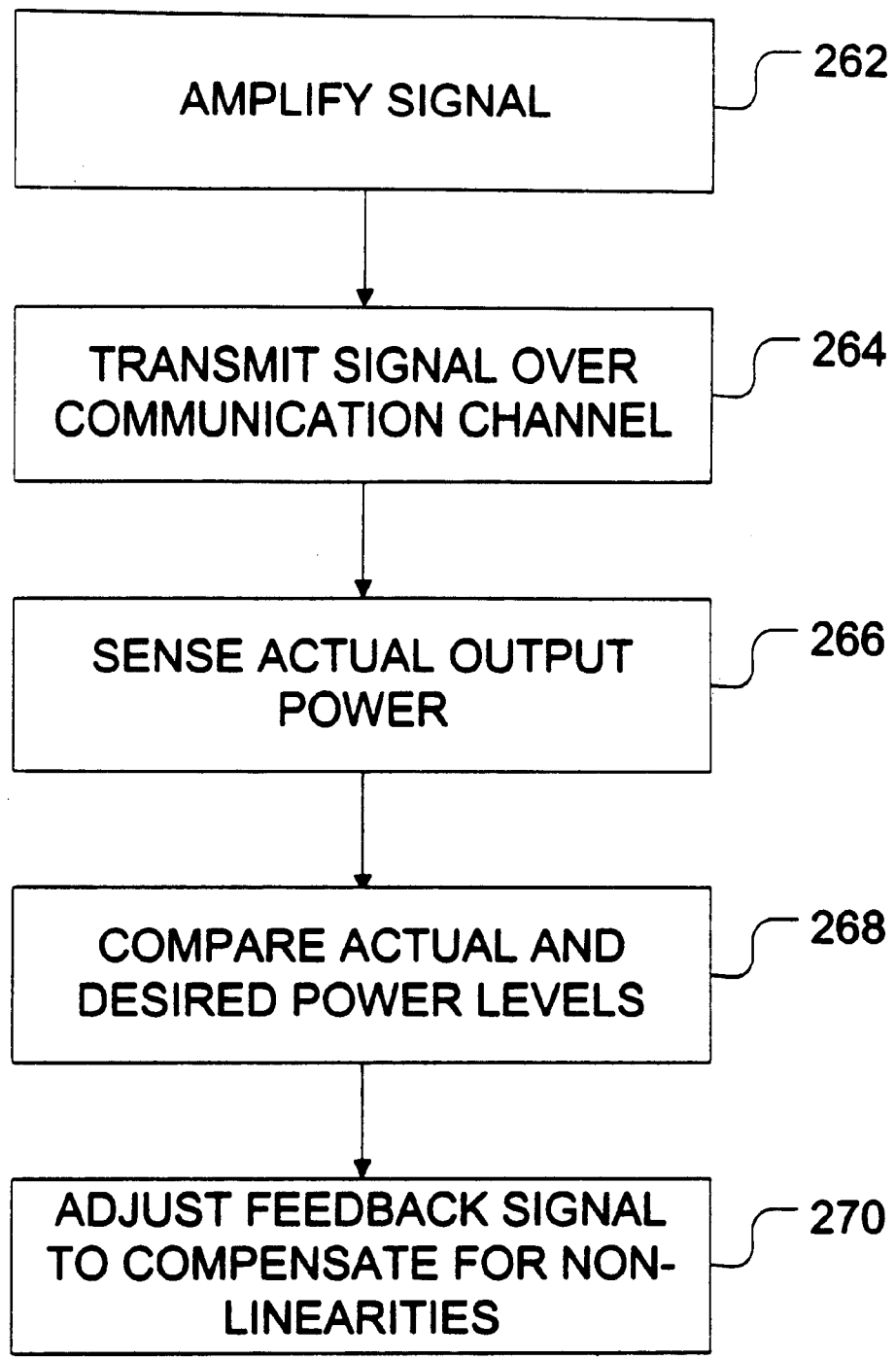
FIG. 4 is an operational flow diagram illustrating the operation of the transfer function generator according to one embodiment of the invention.

The operation of transfer function generator 232 is now described in terms of this example environment. FIG. 4 is an operational flow diagram illustrating the operation of transfer function generator 232 in this example environment according to one embodiment of the invention.

In a step 262, power amplifier 204 amplifies a signal 208 to a desired power level. In one embodiment, this level is controlled by a control voltage level applied to control pins of power amplifier 204. As stated, it is generally desired to control the radiated output power to a desired power level or range of power levels. Transmission of too little power may not satisfy the communication link requirements, while too much power may also cause unwanted side effects such as interference or increased power consumption.

In a step 264, the amplified signal is radiated by antenna 222 across a communications channel. Although the use of antenna 222 in this example embodiment implies a wireless communications channel, it would be obvious to one of ordinary skill in the art that the invention can be implemented in systems having other than a wireless communications channel.

In a step 266, sensor 226 senses the actual output power radiated from antenna 222. A signal indicating the output power level is provided to comparator 220.

In a step 268, comparator 220 compares the actual radiated power sensed by sensor 226 with the desired output power level. In one embodiment, the signal provided by sensor 226 is a voltage level indicating the sensed power level. Additionally, in one embodiment, the desired output power level is the voltage level provided to control pins of amplifier 104. In another embodiment, the desired output power level is a signal representing the desired output power and can be hardwired to a preselected value, or adjusted or set by manual adjustment or by hardware or software. In a preferred embodiment, the desired output power level is set by software to one of a plurality of preset values.

The output of comparator 220 is a difference between the actual radiated power level and the desired power level. Any difference between the actual and desired power levels is, in one embodiment, reflected as a voltage level available at the output of comparator 220.

In one embodiment, an integrator 224 can also be included to integrate the output of comparator over time to determine the magnitude of the difference between the actual and desired signals. The output of integrator 224 represents the actual error that needs to be corrected by the system. As stated above, the output voltage level can be converted to a current by voltage to current converter 228 such that transfer function generator 232 can be implemented using current.

In a step 270, transfer function generator 232 operates to adjust the feedback control signal in such a way as to compensate for non-linearities otherwise present in the system. In one embodiment, transfer function generator 232 exhibits a combination of both linear and non-linear response characteristics such that it can be implemented in systems that also exhibit both linear and non-linear characteristics. For example, transfer function generator 232 can be implemented in the environment described above and illustrated with reference to FIGS. 1 and 2, in which power amplifier 104 can operate in both a linear range 166 and a non-linear range 168.

Preferably, while amplifier 104 is operating in the linear region 166, transfer function generator 232 also operates linearly, such that unwanted non-linearities are not introduced into the system. However, when amplifier 104 is driven to such a level that it is operating in non-linear region 168, transfer function generator 232 responds non-linearly in such a way as to compensate for the non-linearities introduced by power amplifier 104.

Figure 5:
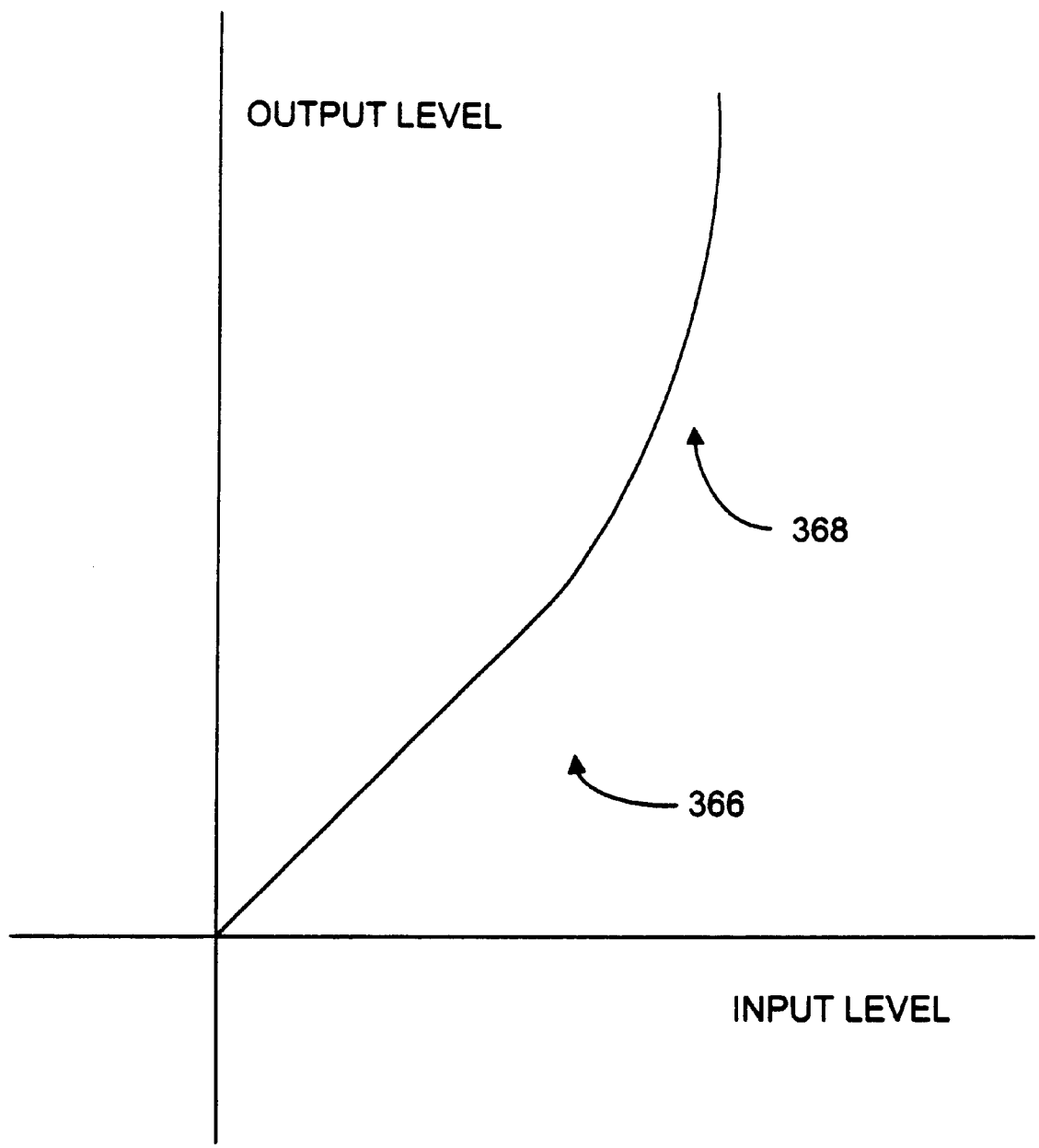
FIG. 5 is a diagram illustrating an example transfer function of the transfer function generator according to one embodiment of the invention.

FIG. 5 is a diagram illustrating an example transfer function that can be implemented with transfer function generator 232. To compensate for the non-linearities introduced in the system as illustrated in the example of FIG. 2, the transfer function of FIG. 5 also includes a linear region 366 and a non-linear region 368. As discussed above, when power amplifier 104 is operating in linear region 166, transfer function generator 232 operates in its linear region 366, thereby not interfering with the operation of the feedback loop. When the error between the actual and the desired output powers is great enough, such that the amplifier is driven to operate in non-linear region 168, transfer function generator 232 operates in its non-linear region 368 to compensate for the non-linearities of power amplifier 104. As illustrated in FIG. 5, the output of transfer function generator 232 in this example is approximately exponential in non-linear region 368. This compensates for the approximately logarithmic increase in output power of power amplifier 104 in the saturated region.

Because, in the example embodiment illustrated in FIG. 3, power amplifier 204 uses voltage to control its output power, current to voltage converter 236 converts the output of transfer function generator 232 to a voltage level. This voltage level is fed back to power amplifier 204 to drive the output power to the desired radiated power level.

Figure 6:
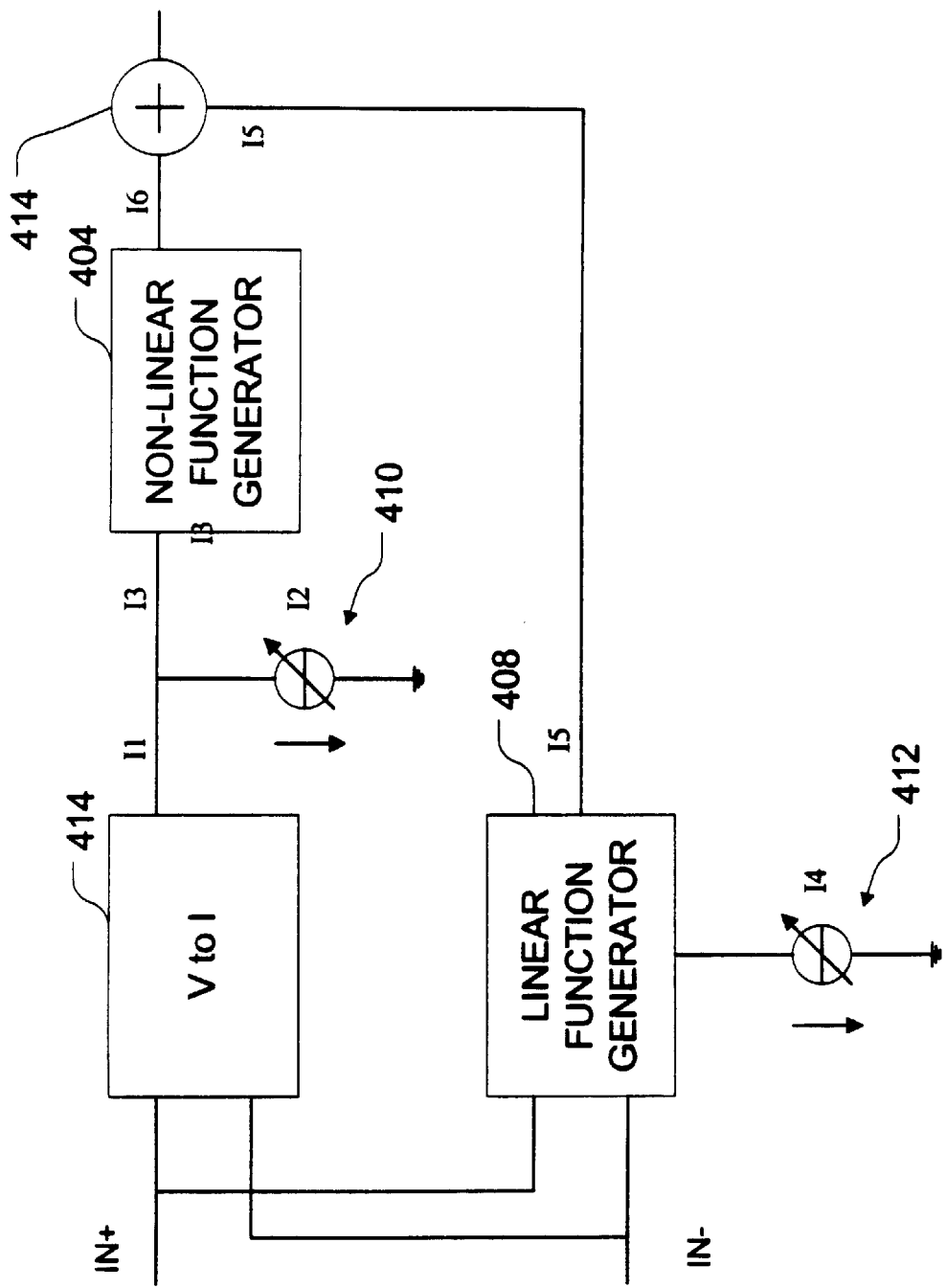
FIG. 6 is a block diagram illustrating an example implementation of a transfer function generator according to one embodiment of the invention.

FIG. 6 is a block diagram illustrating an example implementation of a transfer function generator such as transfer function generator 232. The embodiment illustrated in FIG. 6 includes a non-linear function generator 404, a linear function generator 408, and tuning devices 410, 412. Also illustrated in FIG. 6 is a voltage to current converter 414, allowing non-linear function generator 404 to operate in current instead of voltage. Each of these components are now described. Voltage to current converter 414 is, in one embodiment, a differential amplifier. In this embodiment, voltage to current converter 414 accepts a differential voltage input, represented by IN+ and IN−. In the embodiment illustrated in FIG. 3, this differential input signal is the differential voltage level output of integrator 224. Preferably, voltage to current converter 414 behaves linearly across the expected range of operation so as not to introduce additional non-linearities into the system.

Non-linear function generator 404 generates a non-linear output as a function of a linear input. In one embodiment, non-linear function generator 404 is a cubic function generator. That is, non-linear function generator 404 outputs a signal that varies as the cube of the input current. Alternatively, non-linear function generator 404 can be implemented using any other non-linear function, such as, for example, a square, exponential, logarithmic, or other non-linear function.

Tuning device 410 is used to adjust the point at which non-linear function generator 404 is activated. Preferably, in one embodiment, tuning device 410 is simply a tuning resistor that shunts some or all of the current $I_1$ from voltage to current converter 414 to ground. The amount of current shunted to ground, $I_2$, depends on the value of the resistance. For a smaller resistance, more current $I_2$ is shunted to ground. As more or less current $I_2$ is shunted to ground, this affects the amount of current $I_3$ provided to non-linear function generator 404. As long as $I_1-I_2$ is zero, all of the current is shunted to ground and non-linear function generator 404 is not active. However, where $I_1$ is greater than $I_2$ (i.e., $I_1-I_2$ is greater than zero), non-linear function generator 404 is turned on and outputting a non-linear function in response to the input current. Thus, it can be seen that tuning device 410 operates to define a cut-off below which non-linear function generator 404 is not operative.

In operation, non-linear function generator 404 provides a non-linear output for a given input current $I_3$. As stated above, in one embodiment, this is a cubic output. Because the embodiment illustrated in FIG. 6 is operating in current, it is a simple matter to implement tuning device 410 as a fixed or tunable resistor. Using a tunable or variable resistor allows the amount of current $I_2$ to be adjusted and re-adjusted from application to application, making transfer function generator 232 flexible or applicable to a number of situations.

As stated above, in one embodiment transfer function generator 232 includes both a linear and a non-linear region. The linear region of transfer function generator 232 is provided by linear function generator 408. Linear function generator 408 in one embodiment simply provides an output current which responds linearly to the differential input voltage. As such, in one embodiment, linear function generator 408 can be implemented as a differential amplifier similar to that of voltage to current converter 414.

To provide flexibility in transfer function generator 232 a tuning device 412 is provided with linear function generator 408. Tuning device 412 in the illustrated embodiment enables the adjustment of the amount of current $I_4$ shunted to ground. In one embodiment, tuning device 412 is implemented as a fixed or variable resistor. As the resistance level is increased, the amount of current $I_4$ shunted to ground decreases, resulting in an increase in the amount of current output from linear function generator $I_5$. At the output of transfer function generator 232, the linear current $I_5$ is combined with the non-linear current $I_6$, using, for example, a summing junction 414, to produce a linear and a non-linear region for transfer function generator 232. As with tuning device 410, tuning device 412 can be implemented as a variable resistor such that the linear response characteristics of transfer function generator 232 can be adjusted from application to application.

Figure 7:
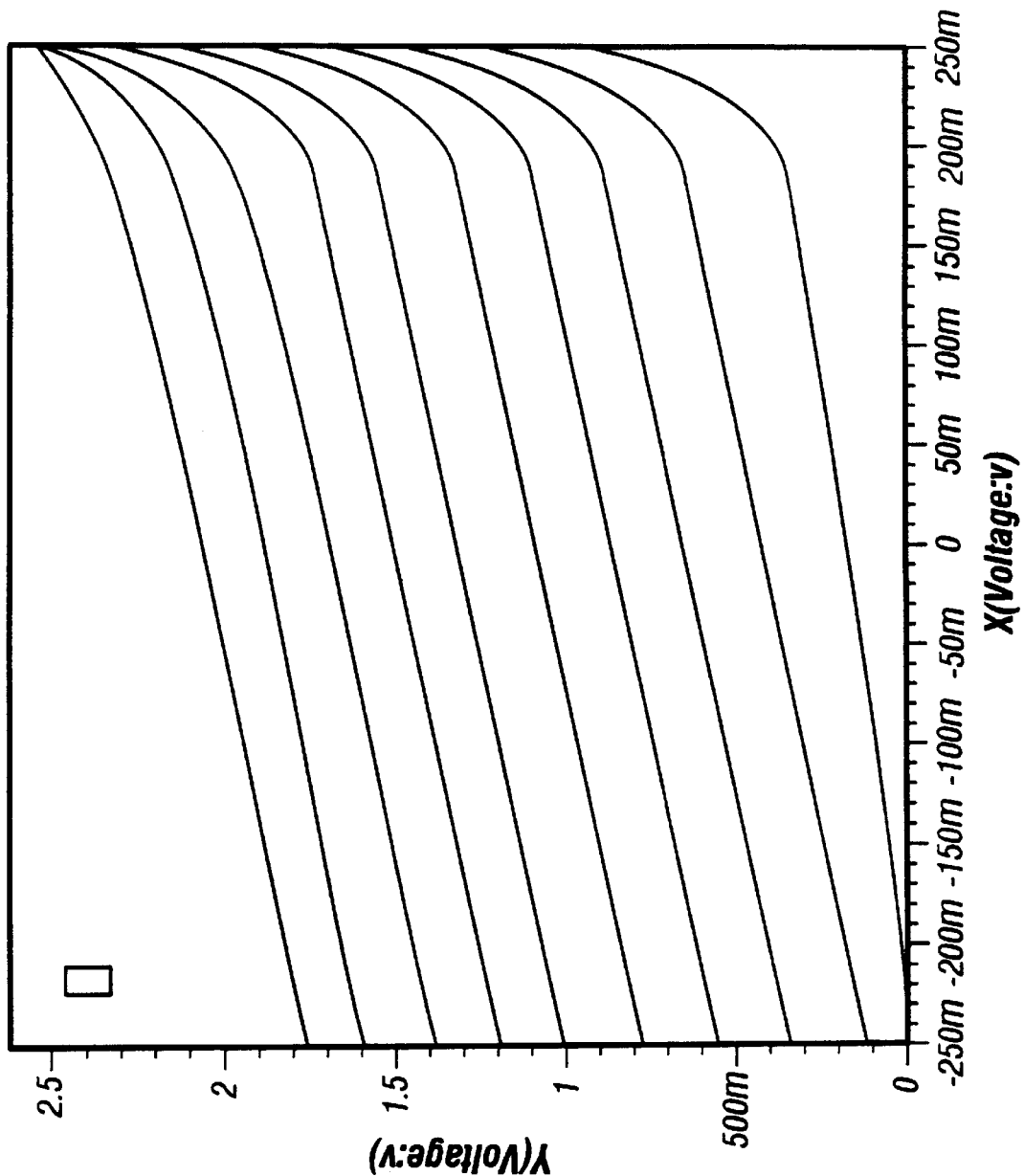
FIG. 7 is a diagram illustrating the output level of a linear function generator as a function of an adjusting a device setting according to one embodiment of the invention.

FIG. 7 is a diagram representing the output of linear function generator 408 for different values of $I_4$. FIG. 7 illustrates the effects of tuning the amount of current $I_4$ shunted to ground on linear function generator 408 in the embodiment illustrated in FIG. 6. As illustrated in FIG. 7, the output of linear function generator 408 is, in fact, linear. Changing the amount of current $I_4$ shunted to ground, adjusts the absolute value of the output current $I_5$ for a given input voltage level. This, after the current to voltage conversion 236, results in a change in the voltage level of the linear region as illustrated in FIG. 7.

Figure 8:
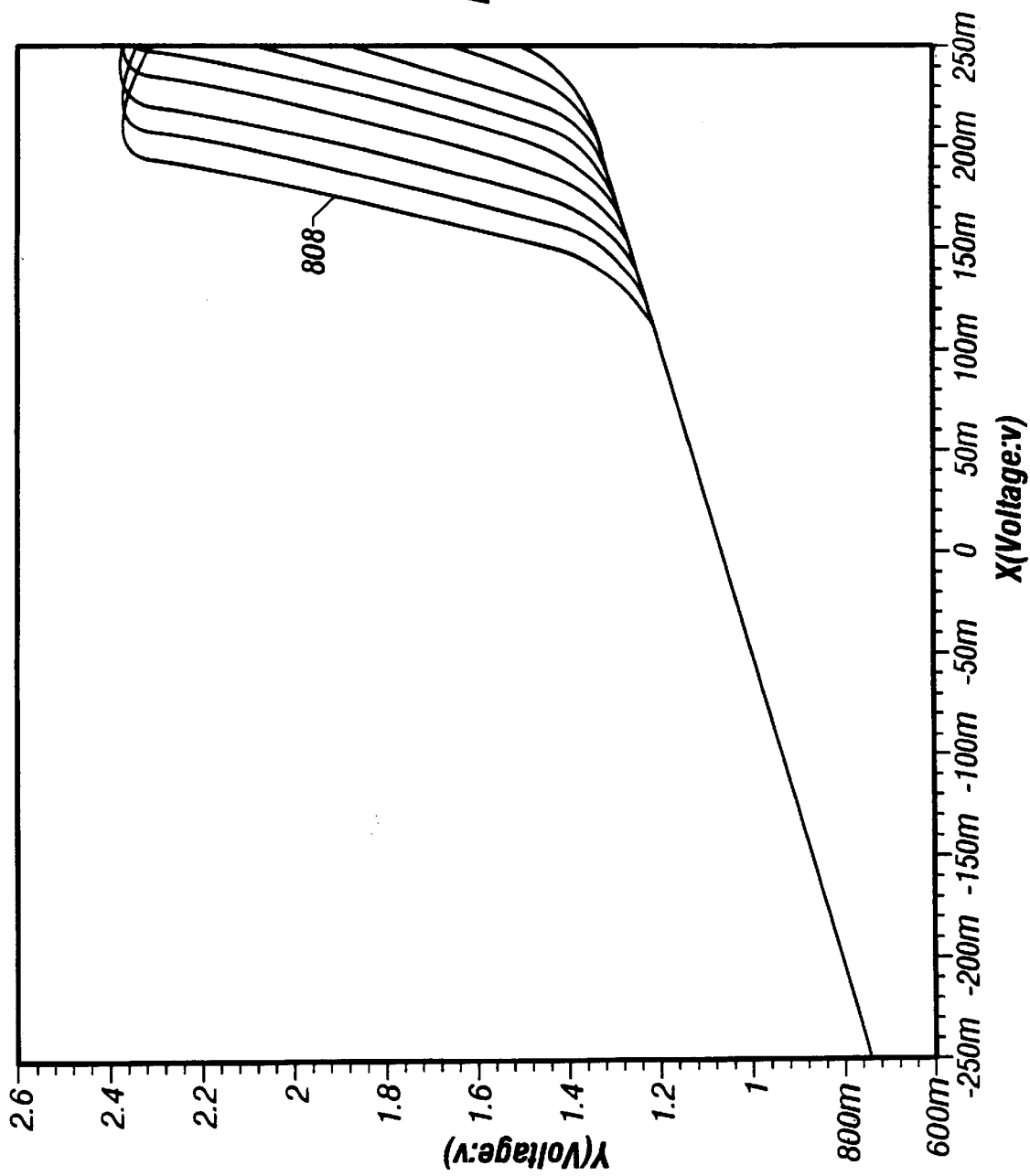
FIG. 8 is a diagram illustrating the turn-on levels for a non-linear function generator as a function of an adjusting a device setting according to one embodiment of the invention.

FIG. 8 is a diagram representing the output of non-linear function generator 404 as a function of its input. FIG. 8 illustrates an example of the results of tuning the amount of current $I_2$ in the embodiment illustrated in FIG. 6. As illustrated in FIG. 8, adjusting the amount of current $I_2$, affects the amount of current I, required to turn on non-linear function generator 404. The function illustrated in FIG. 8, is a cubic function. That is, adjusting the amount of current $I_2$, controls the point at which the transfer function becomes non-linear as illustrated by non-linear regions 808. When non-linear function generator is turned on (i.e., in non-linear region 808), it compensates for the non-linearities of the amplifier operating in its non-linear region 368.

Figure 10:
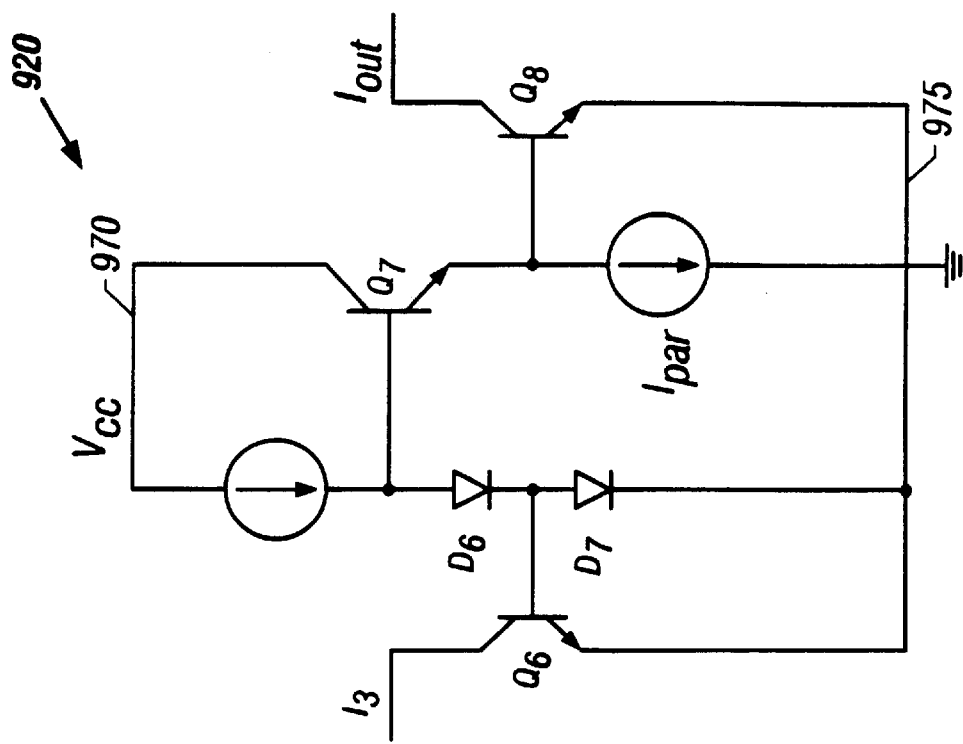
FIG. 10 is a schematic circuit diagram illustrating a second portion of the example cubic function generator according to one embodiment of the invention.
Figure 9:
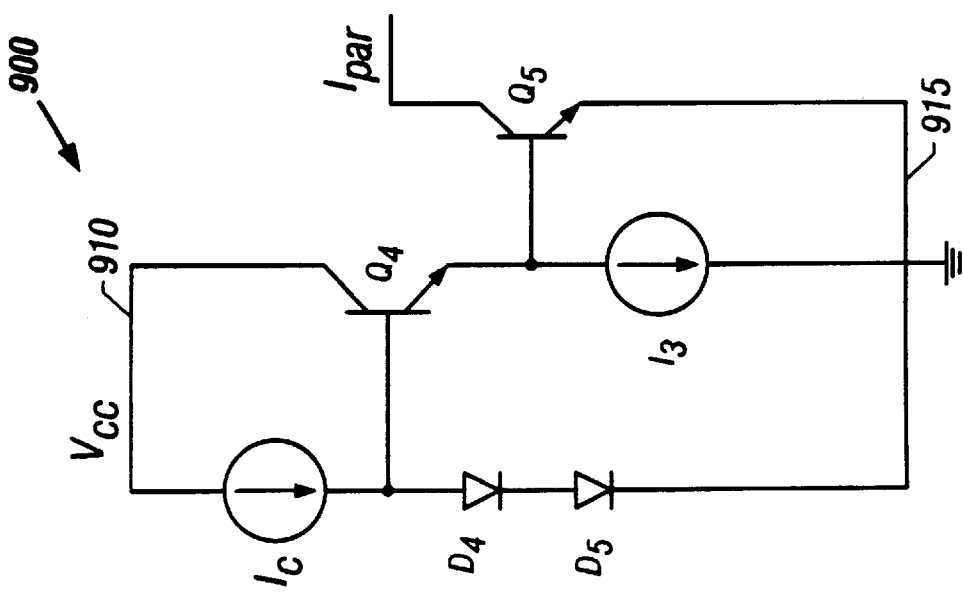
FIG. 9 is a schematic circuit diagram illustrating a first portion of an example cubic function generator according to one embodiment of the invention.
Figure 11:
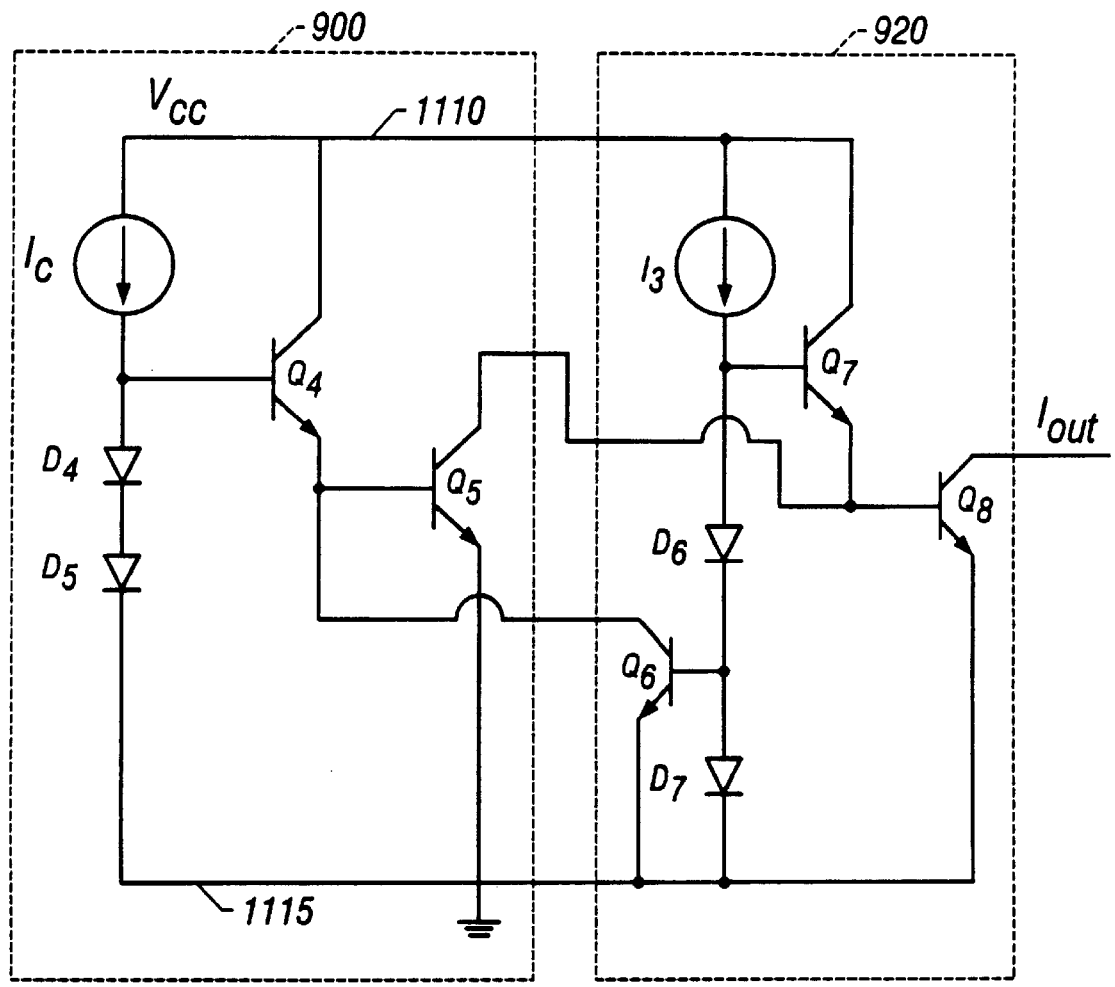
FIG. 11 is a schematic circuit diagram illustrating an example cubic function generator according to one embodiment of the invention.

An example implementation of a non-linear function generator 404 according to one example embodiment the present invention is illustrated in FIGS. 9–11. Specifically, the embodiment of the non-linear function generator 404 illustrated in FIGS. 9–11 is an example implementation for a cubic function generator. In one embodiment, the cubic function generator is designed to work in high-frequency, low voltage applications. In FIG. 9, a first portion 900 of the example implementation of the cubic function generator is illustrated. The first portion 900 in this embodiment includes diodes D4 and D5, transistors Q4 and Q5, and current sources $I_c$ and $I_3$.

A first terminal of current source $I_c$ is connected to the positive voltage rail 910. The positive voltage rail 910 is at a voltage $V_{cc}$. A second terminal of the current source $I_c$ is connected to the anode of the diode D4 and to the base of the transistor Q4. The cathode of the diode D4 is connected to the anode of the diode D5. The cathode of the diode D5 is connected to circuit ground 915.

The collector of the transistor Q4 is connected to the positive voltage rail 910. The emitter of the transistor Q4 is connected to the base of the transistor Q5 and to a first terminal of the current source $I_3$. The second terminal of the current source $I_3$ is connected to circuit ground 915. The collector of the transistor Q5 outputs a current value $I_{par}$. The emitter of the transistor Q5 is connected to the circuit ground 915.

Based upon Kirchhoff's voltage law, the voltages across the diodes D4 and D5 is equal to the voltages across the transistors Q4 and Q5. This may be expressed as follows:

$$V_{be4}+V_{be5}=V_{d4}+V_{d5} \qquad (1)$$

The current through a semiconductor device is defined according to Schottky's equation as follows:

$$I_c=I_s e^{Vsd/Vt} \qquad (2)$$

In Schottky's equation, $I_c$ is the current through the collector of the transistor, $I_s$ is the saturation current of the transistor, $V_{sd}$ is the voltage across the semiconductor device, and $V_t$ is the thermal voltage. By solving Schottky's equation for $V_{sd}$ and making the appropriate substitutions, the equation for the voltages across the diodes and the transistors can be represented as follows:

$$V_1 \ln\left[\frac{I_3}{I_3}\right] + V_1 \ln\left[\frac{I_{par}}{I_3}\right] = 2 V_1 \ln\left[\frac{I_c}{I_3}\right] \quad (3)$$

The thermal voltage $V_t$ is a constant of 25.9 millivolts. Assuming that the diodes D4–D5 and the transistor Q4–Q5 are the same size, then equation (4) may be simplified as follows:

$$\frac{I_3 I_{par}}{I_s^2} = \left[\frac{I_c}{I_s}\right]^2 \quad (4)$$

This equation may be further simplified to be:

$$I_{par} = \frac{I_c^2}{I_3} \quad (5)$$

Therefore, the first portion 900 of the cubic function generator produces an output current $I_{par}$ that is a quadratic function of the input current $I_c$.

The second portion 920 of the example implementation of the cubic function generator is illustrated in FIG. 10. Second portion 920 comprises diodes D6 and D7, transistors Q6–Q8, and current sources $I_{par}$ and $I_3$.

A first terminal of current source $I_3$ is connected to the positive voltage rail 970. The positive voltage rail 970 is at a voltage $V_{cc}$. A second terminal of the current source $I_3$ is connected to the anode of the diode D6 and to the base of the transistor Q7. The cathode of the diode D6 is connected to the anode of the diode D7 and to the base of the transistor Q6. The collector of the transistor Q6 receives a current I3 and the emitter of the transistor Q6 is connected to the circuit ground 975. The cathode of the diode D7 is also connected to the circuit ground 975.

The collector of the transistor Q7 is connected to the positive voltage rail 970. The emitter of the transistor Q7 is connected to the base of the transistor Q8 and to a first terminal of the current source $I_{par}$. The second terminal of the current source $I_{par}$ is connected to the circuit ground 975. The collector of the transistor Q8 outputs a current value $I_{out}$. The emitter of the transistor Q8 is connected to the circuit ground 975.

Again, Kirchhoff's voltage law may be used to express the voltages across the diodes D6 and D7 as equal to the voltages across the transistors Q7 and Q8. This expression is as follows:

$$V_{be7} + V_{be8} + V_{d6} + V_{d7} \quad (6)$$

Solving Schottky's equation for Vd and making the appropriate substitutions, the equation for the voltages across the diodes and the transistors is as follows:

$$V_t \ln\left[\frac{I_{par}}{I_3}\right] + V_t \ln\left[\frac{I_{out}}{I_3}\right] = 2 V_t \ln\left[\frac{I_3}{I_3}\right] \quad (7)$$

This may be simplified to:

$$I_{out} = \frac{I_3^2}{I_{par}} \quad (8)$$

Therefore, the output current $I_{out}$ of the second portion 920 of the cubic function generator is a quadratic function of the input current $I_3$.

The first section 900 and the second section 920 of the cubic function generator may be combined and simplified to produce the example implementation illustrated in FIG. 11. The example implementation of the cubic function generator includes diodes D4–D7, transistors Q4–Q8, and current sources $I_c$ and $I_3$.

In this example implementation, a first terminal of current source $I_c$ is connected to the positive voltage rail 1110. The positive voltage rail 610 is at a voltage $V_{cc}$. A second terminal of the current source $I_c$ is connected to the anode of the diode D4 and to the base of the transistor Q4. The cathode of the diode D4 is connected to the anode of the diode D5. The cathode of the diode D5 is connected to circuit ground 1115.

The collector of the transistor Q4 is connected to the positive voltage rail 1110. The emitter of the transistor Q4 is connected to the base of the transistor Q5 and to the collector of the transistor Q6. The collector of the transistor Q5 is connected to the emitter of the transistor Q7 and the base of the transistor Q8. The emitter of the transistor Q5 is connected to the circuit ground 1115.

The emitter of the transistor Q6 is connected to the circuit ground 615. The base of the transistor Q6 is connected to the cathode of the diode D6 and the anode of the diode D7. The cathode of the diode D7 is connected to the circuit ground 1115. The anode of the diode D6 is connected to a second terminal of the current source 13 and to the base of the transistor Q7. A first terminal of current source $I_3$ is connected to the positive voltage rail 610.

The collector of the transistor Q7 is connected to the positive voltage rail 1110. As stated above, the emitter of the transistor Q7 is connected to the collector of the transistor Q5 and to the base of the transistor Q8. The emitter of the transistor Q8 is connected to the circuit ground 1115. The collector of the transistor Q8 outputs a current value $I_{out}$.

Combining the solution to the output $I_{out}$ of the second portion 920 of the cubic function generator with the solution to the output $I_{par}$ of the first portion 900 of the cubic function generator results in the following:

$$I_{out} = \frac{I_3^3}{I_c^2} \quad (9)$$

This is the cubic function desired. However, the topography of the cubic function generator illustrated generates the desired output current $I_{out}$ with a maximum voltage of $2*(v_{be} + V_{ce(sat)})$. This allows the use of the cubic function generator in low voltage (approximately 2 volts) applications. Further, the signal path of the cubic function generator is through high speed npn devices, thereby making use of the cubic function generator in high frequency applications feasible.

The value of the input current $I_3$ may also be controlled to trim the transfer function. By varying the input current $I_3$, a controllable output $I_{out}$ is generated as follows:

$$I_{out} = \frac{(K * I_3)^3}{I_c^2} \qquad (10)$$

While non-linear function generator 408 can be implemented in a number of different embodiments, a preferred embodiment is fully described in co-pending application, U.S. patent application Ser. No. 09/148,568 now U.S. Pat. No. 6,160,429 titled "A COMPACT CUBIC FUNCTION GENERATOR," which is of common assignee and was filed on Date and which is incorporated herein by reference in its entirety.

In alternative embodiments, transfer function generator 232 can be implemented using hardware, software, or a combination thereof. In one embodiment, for example, transfer function generator 232, or parts thereof, can be implemented using a processor such as, for example, a digital signal processor, and the appropriate software program to cause the processor perform the desired operations of providing a transfer function having a non-linear region.

4. Conclusion

While various embodiments of the present invention have been shown and described above, it should be understood that they have been presented by way of example only, and not limitation. It should be apparent to those of ordinary skill in the art that many other embodiments are possible without departing from the spirit and scope of the invention. Thus, the breadth and scope of the present invention should not be limited by any of the above-described exemplary embodiments, but should be defined only in accordance with the claims and their equivalents.

As would be apparent to one of ordinary skill in the art, real world operating conditions typically lead to situations in which systems, devices or components do not behave according to their ideal characteristics. As such, terms used in this document such as, for example, linear or cubic, should not be construed narrowly as perfectly linear or perfectly cubic. Instead, such terms should be more broadly construed as not only encompassing the ideal condition of, for example, perfectly linear or perfectly cubic, but also the less-than-ideal condition of, for example, roughly linear or roughly cubic.

What is claimed is:

1. A wireless communication device, comprising:
    a power amplifier configured to amplify a signal for transmission by an antenna over a communications channel;
    a power level sensor configured to sense the power level radiated from the antenna;
    a comparator configured to compare the power level sensed by said power level sensor and a desired output power level and to provide an output indicating the difference between the two;
    an integrator configured to integrate the output from said comparator to provide an output indicating an error level; and
    a transfer function generator, comprising:
        a non-linear function generator configured to provide an output that is a non-linear function of an input representing the output from said integrator,
        a linear function generator configured to provide a linear output as a function of an input representing the output from said integrator,
        a junction configured to combine said non-linear output with said linear output;
        a first tuning device to control turning on said non-linear function generator; and
        a second tuning device to control the output of said linear function generator;
    wherein said transfer function generator is configured to provide a non-linear response to the error signal generated by the integrator to compensate for non-linearity introduced elsewhere in the communication device.

2. The wireless communication device of claim 1, wherein said first and second tuning devices are variable resistors.

3. A wireless communication device, comprising:
    a power amplifier configured to amplify a signal for transmission by an antenna over a communications channel;
    a power level sensor configured to sense the power level radiated from the antenna;
    a comparator configured to compare the power level sensed by said power level sensor and a desired output power level and to provide an output indicating the difference between the two;
    an integrator configured to integrate the level output from said comparator to provide an output indicating an error level;
    a transfer function generator, comprising:
        a non-linear function generator configured to provide an output that is a non-linear function of an input representing the output from said integrator,
        a linear function generator configured to provide a linear output as a function of an input representing the output from said integrator, and
        a junction configured to combine said non-linear output current with said linear output circuitry for providing a signal derived from an output of said transfer function generator to control input of said power amplifier;
    wherein said transfer function generator is configured to provide a non-linear response to the error signal generated by the integrator to compensate for non-linearity introduced elsewhere in the communication device.

4. A wireless communication device, comprising:
    a power amplifier configured to amplify a signal for transmission by an antenna over a communications channel;
    a power level sensor configured to sense the power level radiated from the antenna;
    a comparator configured to compare the power level sensed by said power level sensor and a desired output power level and to provide an output indicating the difference between the two;
    an integrator configured to integrate the output from said comparator to provide an output indicating an error level; and
    a transfer function generator, comprising:
        a non-linear function generator configured to provide an output that is a non-linear function of an input representing the output from said integrator,
        a linear function generator configured to provide a linear output as a function of an input representing the output from said integrator, and
        a junction configured to combine said non-linear output with said linear output;
    wherein said transfer function generator is configured to provide a non-linear response to the error signal generated by the integrator to compensate for non-linearity introduced elsewhere in the communication device.

5. A wireless communication device, comprising:

a power amplifier configured to amplify a signal for transmission by an antenna over a communications channel;

a power level sensor configured to sense the power level radiated from the antenna;

a comparator configured to compare the power level sensed by said power level sensor and a desired output power level and to provide an output indicating the difference between the two;

an integrator configured to integrate the output from said comparator to provide an output indicating an error level;

a transfer function generator, comprising:
  a non-linear function generator configured to provide, when said power amplifier is in its non-linear region, an output that is a non-linear function of an input representing the output from said integrator;
  a linear function generator configured to provide, when said power amplifier is in its linear region, a linear output as a function of an input representing the voltage output from said integrator; and
  a junction configured to combine said non-linear output with said linear output;
  a first tuning device to control the amount of input needed to turn on said non-linear function generator; and
  a second tuning device to control the output level of said linear function generator; and wherein said transfer function generator is configured to provide a non-linear response to the error signal generated by the integrator to compensate for non-linearity introduced elsewhere in the communication device.

6. The wireless communication device of claim 5, wherein said first and second tuning devices are variable resistors.

7. The wireless communication device of claim 5, further comprising:

a voltage to current converter, configured to convert an output voltage of said integrator into a current; and a current to voltage converter configured to convert a current output from said transfer function generator to a voltage level and to provide said voltage level to control pins of said power amplifier.

8. The wireless communication device of claim 5, further comprising a voltage to current converter, configured to convert a differential voltage into a current for input to said non-linear function generator.

* * * * *

UNITED STATES PATENT AND TRADEMARK OFFICE
CERTIFICATE OF CORRECTION

PATENT NO. : 6,321,072 B1
DATED : November 20, 2001
INVENTOR(S) : Stefano Cipriani, Lorenzo Capineto and Anthony A. Takeshian It is certified that error appears in the above-identified patent and that said Letters Patent is hereby corrected as shown below:

Column 12,
Line 20, after "integrate the", delete "level".
Line 31, after "output", insert -- ; --.
Line 33, after "generator to", insert -- a --.

Column 13,
Line 22, before "output", delete "voltage".

Column 14,
Line 1, after "output", delete "level".

Signed and Sealed this

Twenty-eighth Day of September, 2004

JON W. DUDAS
*Director of the United States Patent and Trademark Office*